(12) United States Patent
Lee

(10) Patent No.: US 7,813,190 B2
(45) Date of Patent: Oct. 12, 2010

(54) INPUT CIRCUIT OF SEMICONDUCTOR MEMORY DEVICE ENSURING ENABLED DATA INPUT BUFFER DURING DATA INPUT

(75) Inventor: Sang Hee Lee, Seoul (KR)

(73) Assignee: Hynix Semiconductor Inc., Kyoungki-do (KR)

(*) Notice: Subject to any disclaimer, the term of this patent is extended or adjusted under 35 U.S.C. 154(b) by 75 days.

(21) Appl. No.: 12/206,020

(22) Filed: Sep. 8, 2008

(65) Prior Publication Data

US 2009/0161446 A1 Jun. 25, 2009

(30) Foreign Application Priority Data

Dec. 21, 2007 (KR) .................. 10-2007-0135578

(51) Int. Cl.
*G11C 16/04* (2006.01)

(52) U.S. Cl. .............. 365/189.05; 365/194; 365/233.1; 365/233.18

(58) Field of Classification Search ............ 365/189.05, 365/194, 233.1, 233.18, 230.06
See application file for complete search history.

(56) References Cited

U.S. PATENT DOCUMENTS 5,923,595 A * 7/1999 Kim ..................... 365/189.05
6,445,642 B2 * 9/2002 Murakami ............... 365/233.1

* cited by examiner

*Primary Examiner*—David Lam
(74) *Attorney, Agent, or Firm*—Ladas & Parry LLP

(57) ABSTRACT

An input circuit of a semiconductor memory device that prevents data from being input into a data input buffer prior to the enablement of the data input buffer. The input circuit includes an input buffer enabling control unit that generates an input buffer enabling signal which is enabled before a point at which data is input and which has an enabling period of at least a predetermined burst length. A data input buffer is controlled by the input buffer enabling signal, and the data input buffer buffers and outputs the data during the enabling period of the input buffer enabling signal.

11 Claims, 5 Drawing Sheets

INPUT CIRCUIT OF SEMICONDUCTOR MEMORY DEVICE ENSURING ENABLED DATA INPUT BUFFER DURING DATA INPUT

CROSS-REFERENCE TO RELATED APPLICATIONS

The present application claims priority to Korean patent application number 10-2007-0135578 filed on Dec. 21, 2007, which is incorporated herein by reference in its entirety.

BACKGROUND OF THE INVENTION

The present invention relates to a semiconductor memory device, and more particularly to an input circuit of a semiconductor memory device which inputs data into an internal circuit during a write operation.

In general, a data input buffer is turned on to buffer data when a write command is inputted, and turned off after ensuring a burst operation.

Typically, an externally input write command is decoded and then latched in synchronization with an internal clock, and is thereby converted into a write pulse. The data input buffer is turned on when the write pulse is generated.

In other words, a typical data input buffer is turned on by a write pulse generated in synchronization with an internal clock so that the data input buffer can buffer data.

A typical write pulse generation circuit for generating a write pulse is configured as shown in FIG. 1.

Specifically, referring to FIG. 1, the typical write pulse generation circuit receives, via the gates of NMOS transistors N2 and N3, an input signal IN generated by decoding a write command and an inverted input signal INB whose phase is the inverse of the input signal IN, respectively. Hereinafter, the input signal IN is assumed to be of a high level.

An internal clock ICLK is toggled and a NMOS transistor N1 is turned on when the internal clock ICLK becomes a high level. PMOS transistors P1 and P2 and NMOS transistors N4 and N5 (which are configured in a latch structure) allow node ND1 to maintain a low level and node ND2 to maintain a high level.

An inverter INV1 inverts the signal of the node ND1 to output a write pulse WTP. The signal of the node ND2 is inputted into an inverter INV2; however, this signal is unnecessary and thus the output terminal of the inverter INV2 is floated.

Thereafter, when the internal clock ICLK transitions to the low level, PMOS transistors P3 to P5 are turned on to precharge the two nodes ND1 and ND2 to the high level.

As such, the write pulse WTP is synchronized with the internal clock ICLK and is enabled when the internal clock ICLK is enabled (the high level) and disabled when the internal clock ICLK is disabled (the low level).

However, in conditions in which the additive latency (AL) is '0' and column access strobe (CAS) latency (CL) is '2' in DDR1 or DDR2, data is inputted after '1[tck]' (i.e., one period of the clock) after the input of the write command. At this time, the data may be inputted at '1[tck]-0.25[tck]' under a condition in which tDQSS (the time from the clock to the first rising edge of the data strobe signal DQS-In) is minimum.

In this case, no problems occur during low frequency operation; however, during high frequency operation, the enabling point of the write pulse WTP can be delayed when variations in external environment (for example; process, voltage, and temperature) occur.

Accordingly, during high frequency operation, data is input into the data input buffer before the data input buffer is turned on, since the data is inputted into the data input buffer without delay, while the write pulse WTP is enabled late. Therefore, there is a problem in the typical configuration, in that defects are generated when data is not buffered normally.

SUMMARY OF THE INVENTION

The present invention provides a semiconductor memory device that prevents defects caused by data that is inputted into a data input buffer before the data input buffer is enabled.

According to a first embodiment of the present invention, there is provided an input circuit of a semiconductor memory device which includes an input buffer enabling control unit generating an input buffer enabling signal which is enabled prior to a point at which data is input and which has an enabling period ensuring at least a predetermined burst length; and a data input buffer to which the data is input, the data input buffer being controlled by the input buffer enabling signal and buffering and outputting the data during the enabling period of the input buffer enabling signal.

Preferably, the input buffer enabling control unit generates the input buffer enabling signal, which is enabled before a point of data input, using an external command.

Preferably, the input buffer enabling control unit generates the input buffer enabling signal, which is asynchronous with a clock, using the external command.

Preferably, input buffer enabling control unit includes a command buffer unit outputting an internal command by buffering the external command; a command decoder outputting a write command signal by decoding the internal command; a write pulse generation unit generating a write pulse using the write command signal; and an input buffer enabling signal generation unit generating the input buffer enabling signal to be enabled in synchronization with the write pulse, with the input buffer enabling signal being generated according to burst information such that the enabling period corresponds to the burst length.

Preferably, the write pulse generation unit generates the write pulse, which is enabled when the write command signal is enabled and has a predetermined pulse width, using the write command signal.

Preferably, the write pulse generation unit includes a delaying unit delaying the write command signal; and a combining unit performing a logical operation on the write command signal and an output of the delaying unit to generate the write pulse such that the pulse width of the write pulse corresponds to the delay of the write command signal.

Preferably, the input buffer enabling signal generation unit includes a driving unit pull-up and pull-down driving in response to the write pulse; a latch unit latching an output of the driving unit and outputting the input buffer enabling signal; and a precharge unit selectively precharging the output of the driving unit according to the state of a burst signal corresponding to the burst information.

According to a second embodiment of the present invention, there is provided an input circuit of a semiconductor memory device, which includes: a write pulse generation unit generating a write pulse using a write command signal inputted from outside the input circuit; an input buffer enabling signal generation unit receiving the write pulse and generating an input buffer enabling signal in response to the write pulse, the input buffer enabling signal being enabled prior to the point at which data is input and having an enabling period ensuring at least a predetermined burst length; and a data input buffer to which the data is input, the data input buffer being controlled by the input buffer enabling signal to buffer and output the data during the enabling period of the input buffer enabling signal.

Preferably, the write pulse generation unit generates the write pulse, which is asynchronous with a clock, using the write command signal.

Preferably, the write pulse generation unit generates the write pulse, which is enabled when the write command signal is enabled and has a predetermined pulse width, using the write command signal.

Preferably, the write pulse generation unit includes a delaying unit delaying the write command signal; and a combining unit performing a logical operation on the write command signal and an output of the delaying unit to generate the write pulse such that the pulse width of the write pulse corresponds to the delay of the write command signal.

Preferably, the input buffer enabling signal generation unit includes a driving unit pull-up and pull-down driving in response to the write pulse; a latch unit latching an output of the driving unit and outputting the input buffer enabling signal; and a precharge unit precharging the output of the driving unit to a predetermined point corresponding to the burst length.

DESCRIPTION OF SPECIFIC EMBODIMENTS

Hereinafter, preferred embodiments of the present invention will be described in detail with reference to the accompanying drawings.

The present invention discloses an input circuit that ensures that a data input buffer is enabled before data is inputted into the data input buffer by setting the enabling point of the data input buffer to be the point at which the write command is inputted from outside the input circuit.

Figure 1:
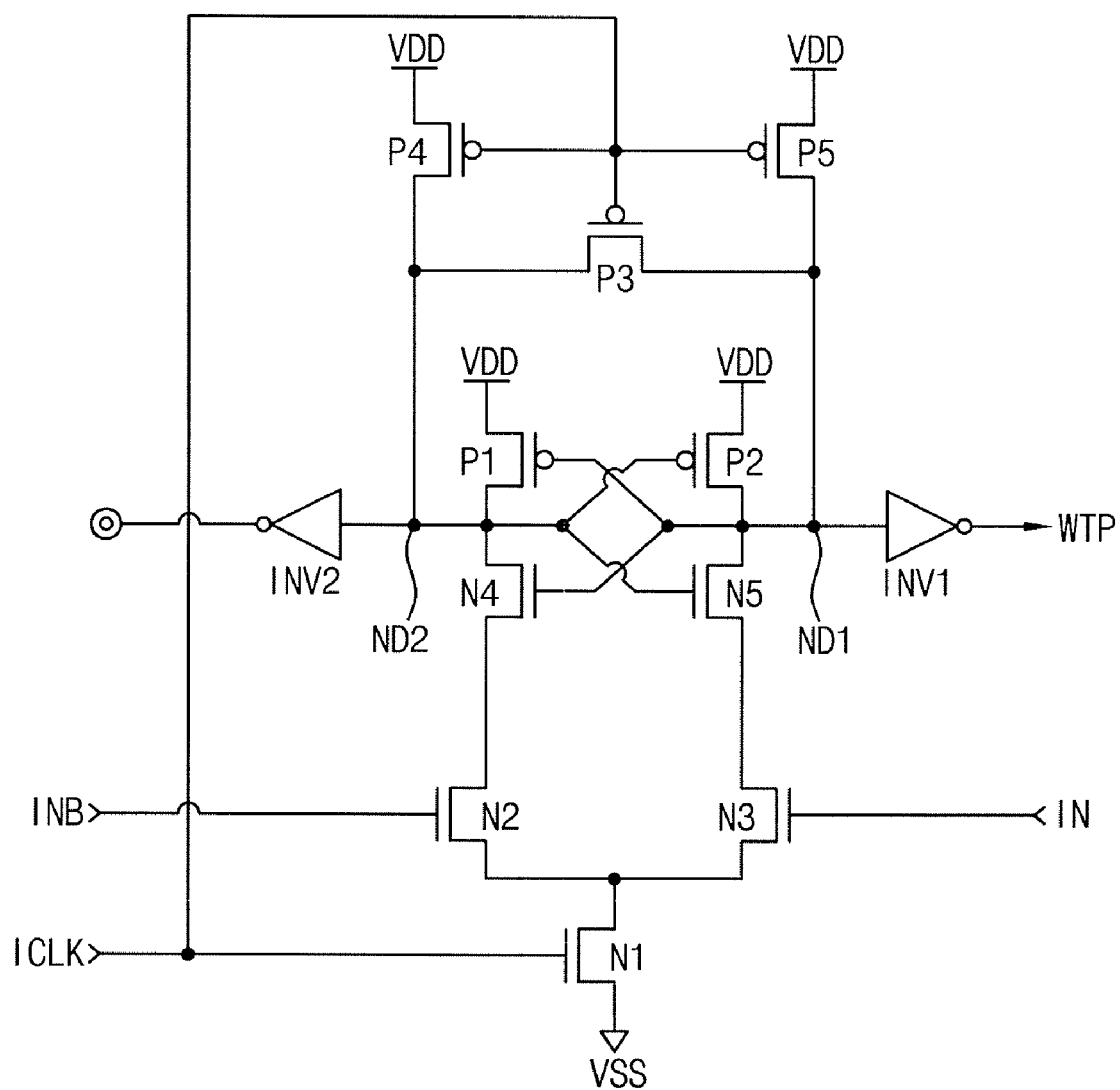
FIG. 1 is a circuit diagram showing a conventional write pulse generation circuit of a semiconductor memory device.
Figure 2:
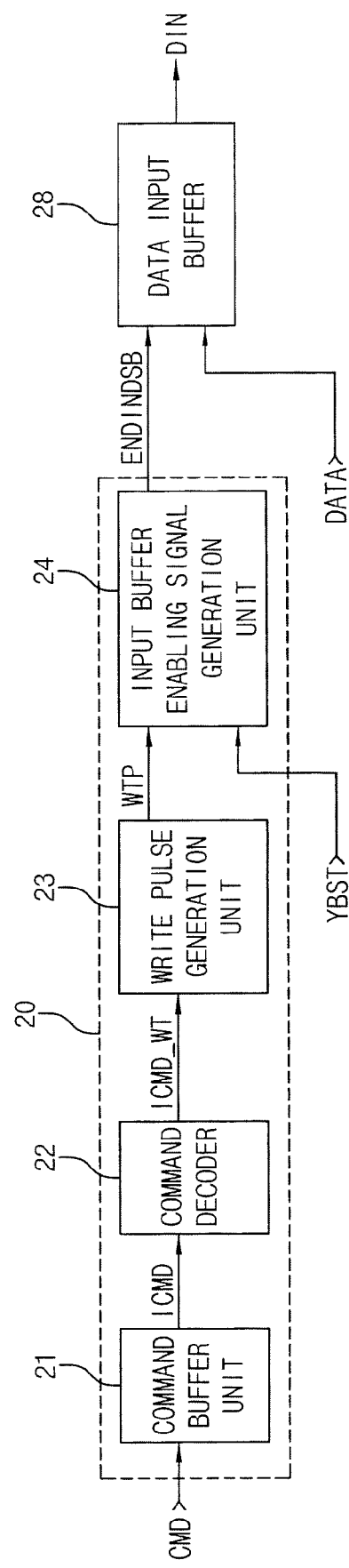
FIG. 2 is a circuit diagram showing an input circuit of a semiconductor memory device according to the present invention.

Referring to FIG. 2, an input circuit of a semiconductor memory device according to the present invention includes an input buffer enabling control unit 20 and a data input buffer 28.

The input buffer enabling control unit 20 generates an input buffer enabling signal ENDINDSB which is enabled before data is input to the data input buffer 28, and which has an enabling period corresponding to a predetermined burst length. To this end, the input buffer enabling control unit 20 receives an external command CMD and a burst signal YBST. The input buffer enabling signal ENDINDSB is enabled by the input of the external command CMD and the enabling period (which corresponds to the burst length) is determined according to the burst signal YBST.

The data input buffer 28 is turned on in response to the input buffer enabling signal ENDINDSB, and it buffers data DATA to output an input data DIN during the enabling period of the input buffer enabling signal ENDINDSB.

In the input circuit of a semiconductor memory device according to the present invention having the above configuration, the input buffer enabling control unit 20 may include a command buffer unit 21, a command decoder 22, a write pulse generation unit 23, and an input buffer enabling signal generation unit 24.

The command buffer unit 21 buffers the external command CMD to output an internal command ICMD.

Figure 3:
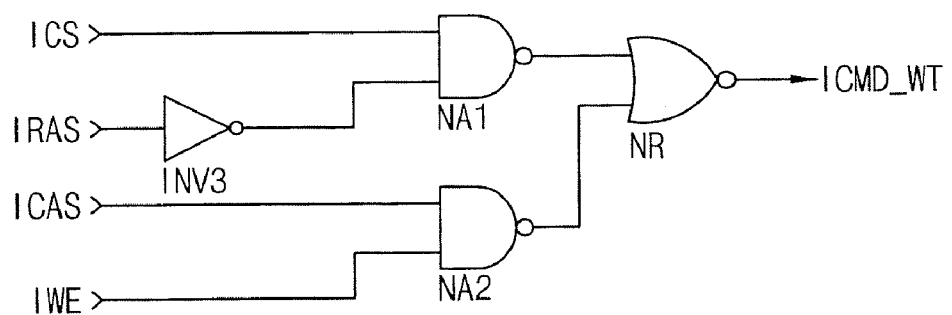
FIG. 3 is a circuit diagram showing an example of the command decoder of FIG. 2.

The command decoder 22 decodes the internal command ICMD to output a write command signal ICMD_WT. FIG. 3 is a circuit diagram showing an example of the command decoder 22 of FIG. 2.

Referring to FIG. 3, the command decoder 22 may include an inverter INV3 which inverts a row address strobe (RAS) signal IRAS, a NAND gate NA1 which performs a logical operation on a chip selection signal ICS and the output of the inverter INV3, a NAND gate NA2 which performs a logical operation on a CAS signal ICAS and a write enabling signal IWE, and a NOR gate NR which performs a logical operation on the output of the NAND gate NA1 and the output of the NAND gate NA2 to output the write command signal ICMD_WT. Herein, the chip selection signal ICS, the RAS signal IRAS, the CAS signal ICAS, and the write enabling signal IWE correspond to the internal command signal ICMD.

The command decoder 22 having the above configuration combines the chip selection signal ICS, the RAS signal IRAS, the CAS signal ICAS, and the write enabling signal IWE to output the write command signal ICMD_WT, and the outputted write command signal ICMD_WT is inputted into the write pulse generation unit 23 and used to generate the write pulse WTP.

The write pulse generation unit 23 generates the write pulse WTP using the write command signal ICMD_WT; and particularly, the write pulse generation unit 23 generates a write pulse WTP which is enabled when the write command signal ICMD_WT is enabled and which has a predetermined pulse width.

Figure 4:
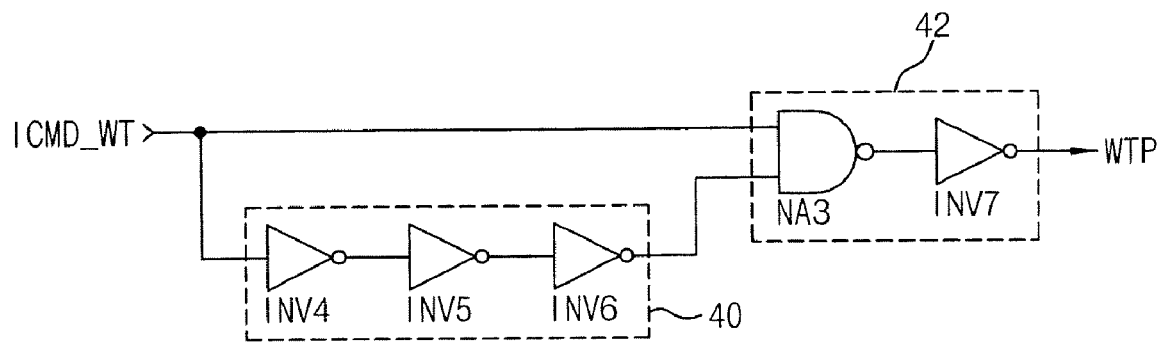
FIG. 4 is a circuit diagram showing an example of the write pulse generation unit of FIG. 2.

FIG. 4 is a circuit diagram showing an example of the write pulse generation unit 23 of FIG. 2. The write pulse generation unit 23 may include, for example, a delaying unit 40 and a combining unit 42.

Specifically, the delaying unit 40 includes an inverter chain INV4~INV6, and the inverter chain INV4~INV6 is preferably provided with an odd number of inverters.

The combining unit 42 may include a NAND gate NA3 which performs a logical operation on the write command signal ICMD_WT and the output of the delaying unit 40, and an inverter INV7 which inverts the output of the NAND gate NA3 to output the write pulse WTP.

The write pulse generation unit 23 including the above configuration receives the write command signal ICMD_WT and generates a write pulse WTP which is enabled when the write command signal ICMD_WT is enabled and has a pulse width corresponding to the delay caused by the delaying unit 40.

The write pulse WTP generated by the write pulse generation unit 23 is inputted into the input buffer enabling signal generation unit 24. As shown in FIG. 2, the input buffer enabling signal generation unit 24 receives the write pulse WTP and the burst signal YBST and generates an input buffer enabling signal ENDINDSB which is enabled in synchronization with the enablement of the write pulse WTP and which has an enabling period corresponding the burst length of the burst signal YBST.

Figure 5:
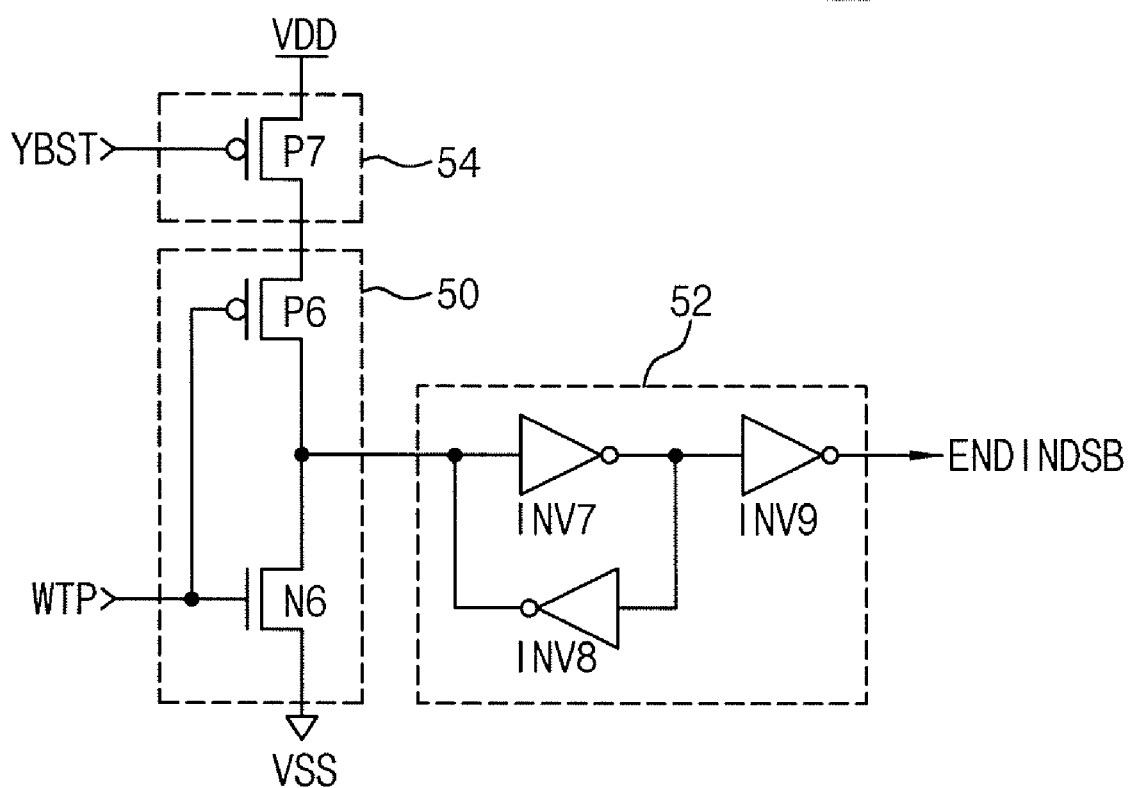
FIG. 5 is a circuit diagram showing an example of the input buffer enabling signal generation unit of FIG. 2.

FIG. 5 is a circuit diagram showing an example of the input buffer enabling signal generation unit 24 of FIG. 2. The input buffer enabling signal generation unit 24 may include, for example, a driving unit 50, a latch unit 52, and a precharge unit 54.

Specifically, the driving unit 50 performs pull-up and pull-down drives in response to the write pulse WTP. The driving unit 50 may include, for example, an NMOS transistor N6 which pull-down drives in response to the write pulse WTP, and a PMOS transistor P7 which pull-up drives in response to the write pulse WTP. Herein, the PMOS transistor P6 is connected between a PMOS transistor P7 of the precharge unit 54 and an output terminal, and the NMOS transistor N6 is connected between the output terminal and a ground voltage VSS terminal.

The latch unit 52 latches the output of the driving unit 50 and outputs the input buffer enabling signal ENDINDSB. For example, the latch unit 52 may include two inverters INV7 and INV8 which latch an output of the driving unit 50, and an inverter INV9 which inverts the output of the inverter INV7 to output the input buffer enabling signal ENDINDSB.

The precharge unit 54 selectively precharges the output of the driving unit 50 according to the state of the burst signal YBST. The precharge unit 54 may include, for example, the PMOS transistor P7 which pull-up drives in response to the burst signal YBST. Herein, the PMOS transistor P7 is connected between a power voltage VDD terminal and the PMOS transistor P6.

When the burst signal YBST and the write pulse WTP are enabled, the input buffer enabling signal generation unit 24 pull-down drives, and the driven signal is latched and output as the input buffer enabling signal ENDINDSB. The input buffer enabling signal ENDINDSB maintains an enabled state via the latch unit 52 even when the write pulse WTP is disabled.

Thereafter, when the burst signal YBST is disabled in the state in which the write pulse WTP is disabled, the output terminal of the driving unit 50 is precharged to a high level since the driving unit 50 pull-up drives and the power voltage VDD is supplied from the precharge unit 54, and thus the input buffer enabling signal ENDINDSB is disabled.

The input buffer enabling signal ENDINDSB generated by the input buffer enabling signal generation unit 24 is inputted into the data input buffer 28. As shown in FIG. 2, the data input buffer 28 receives the input buffer enabling signal ENDINDSB and data DATA and buffers the data DATA during the enabling period of the input buffer enabling signal ENDINDSB to output the input data DIN.

Figure 6:
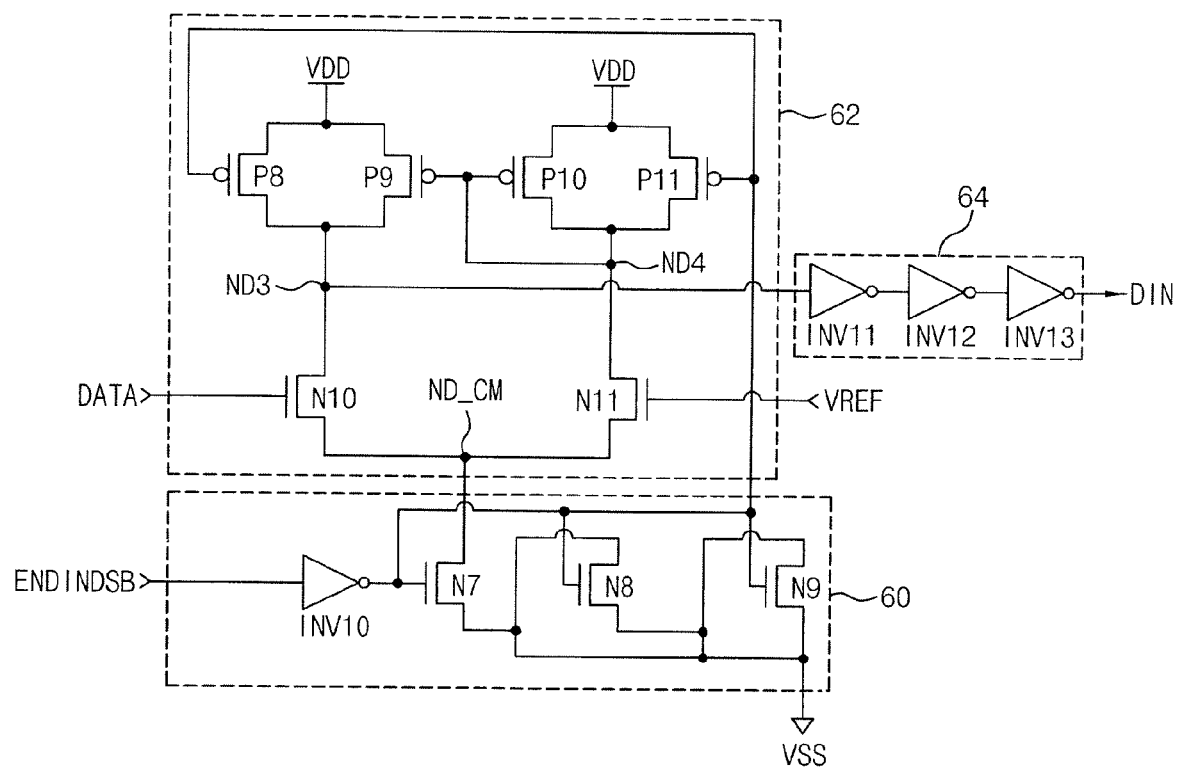
FIG. 6 is a circuit diagram showing an example of the data input buffer of FIG. 2.

FIG. 6 is a circuit diagram showing an example of the data input buffer 28 of FIG. 2. The data input buffer 28 may include, for example, an enabling control unit 60, a buffer unit 62, and an output unit 64.

Specifically, the enabling control unit 60 controls the enablement of the buffer unit 62 using the input buffer enabling signal ENDINDSB. The enabling control unit 60 may include, for example, an inverter INV10 which inverts the input buffer enabling signal ENDINDSB, and an NMOS transistor N7 which pulls down a common node ND_CM of the buffer unit 62 in response to the output of the inverter INV10. The enabling control unit 60 may further include two NMOS transistors N8 and N9 which receive the input buffer enabling signal ENDINDSB via their respective gates. Each of the NMOS transistors N8 and N9 have a terminal connected to the ground voltage VSS terminal.

The buffer unit 62 may be formed in a differential amplifying structure that compares the data DATA with a reference voltage VREF. The buffer unit 62 may include, for example, PMOS transistors P8 and P11 which precharge two nodes ND3 and ND4 to the level of the power voltage VDD in response to the output of the inverter INV10, two PMOS transistors P9 and P10 which provide the same current to the two nodes ND3 and ND4 using the potential of the node ND4, and two NMOS transistors N10 and N11 having a differential pair configuration which receive respectively the data DATA and the reference voltage VREF via their respective gates and which are connected to the two nodes ND3 and ND4 such that the potential of the two nodes ND3 and ND4 depends on the state of the data DATA and the reference voltage VREF. Herein, one terminal of each of the two NMOS transistors N10 and N11 is connected to the common node ND_CM.

The output unit 64 inverts the output of the buffer unit 62 to output the input data DIN. The output unit 64 may include, for example, an odd number of inverters INV11~INV13 which are connected in series and which delay and invert the signal output from the node ND3 of the buffer unit 63.

The input circuit of a semiconductor memory device according to the present invention has a configuration that quickly enables the data input buffer 28 using the command CMD before the point of input of the data DATA occurring when the command CMD is inputted from outside the input circuit.

Specifically, when the command CMD is inputted from outside the input circuit (the command CMD is inputted before a set up time), the write command ICMD_WT is generated by the command buffer unit 21 and the command decoder 22. The write command ICMD_WT is inputted into the write pulse generation unit 23, and the write pulse WTP having the predetermined pulse width is generated.

In other words, the write pulse WTP which determines the enabling period of the data input buffer 28 is not generated in synchronization with the internal clock (as in the related art), but is instead generated simultaneously with the input of the command CMD from outside the input circuit. By utilizing the write pulse generation unit 23, the write pulse WTP has the same pulse width as that of the related art.

Therefore, the present invention provides an advantage, in that defects are prevented, since the present invention ensures that the data input buffer 28 is enabled prior to the input of data into the data input buffer 28.

Particularly, when the write pulse that enables the data input buffer 28 is generated nearly simultaneously with the input of the command instead of being synchronized with the clock the data input buffer operates in a stable manner even during high frequency operation when data is inputted quickly into the data input buffer 28 in synchronization with the clock.

As described above, in the present invention it is possible to quickly enable the data input buffer by generating a signal that enables the data input buffer nearly simultaneously with the input of the command, and therefore the present invention has an advantage in that defects caused by the data input buffer according to the point of data input are not a concern. Particularly, in the present invention, it is possible to ensure stable operation of the data input buffer by preventing the data from being inputted into the data input buffer prior to the enablement of the data input buffer during high frequency operation.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. An input circuit of a semiconductor memory device, comprising:
   an input buffer enabling control unit generating an input buffer enabling signal which is enabled before a point at which an external data is input and which has an enabling period having a length that is at least that of a predetermined burst length; and
   a data input buffer to which the external data is input, the data input buffer being controlled by the input buffer enabling signal to buffer and output the external data as an internal data during the enabling period of the input buffer enabling signal,
   wherein the input buffer enabling control unit uses an external command to generate the input buffer enabling signal.

2. The input circuit of a semiconductor memory device as set forth in claim 1, wherein the input buffer enabling signal generated by the input buffer enabling control unit is not synchronized with a clock.

3. The input circuit of a semiconductor memory device as set forth in claim 1, wherein the input buffer enabling control unit comprises:
   a command buffer unit buffering the external command to output an internal command;
   a command decoder decoding the internal command to output a write command signal;
   a write pulse generation unit generating a write pulse using the write command signal; and
   an input buffer enabling signal generation unit generating the input buffer enabling signal to be enabled in synchronization with the write pulse, wherein the input buffer enabling signal is generated according to burst information such that the enabling period corresponds to the burst length.

4. The input circuit of a semiconductor memory device as set forth in claim 3, wherein the write pulse generated by the write pulse generation unit is generated using the write command signal, wherein the write pulse is enabled when the write command signal is enabled and has a predetermined pulse width.

5. The input circuit of a semiconductor memory device as set forth in claim 4, wherein the write pulse generation unit comprises:
   a delaying unit delaying the write command signal; and
   a combining unit performing a logical operation on the write command signal and an output of the delaying unit to generate the write pulse such that pulse width of the write pulse corresponds to the delay of the write command signal.

6. The input circuit of a semiconductor memory device as set forth in claim 3, wherein the input buffer enabling signal generation unit comprises:
   a driving unit which performs a pull-up or pull-down drive in response to the write pulse;
   a latch unit latching an output of the driving unit and outputting the input buffer enabling signal; and
   a precharge unit selectively precharging the output of the driving unit according to the enablement state of a burst signal corresponding to the burst information.

7. An input circuit of a semiconductor memory device, comprising:
   a write pulse generation unit generating a write pulse using a write command signal inputted from outside the input circuit;
   an input buffer enabling signal generation unit receiving the write pulse and generating an input buffer enabling signal in response to the write pulse, the input buffer enabling signal being enabled before the point at which data is input and having an enabling period that has a length that is at least that of a predetermined burst length; and
   a data input buffer to which the data is input, the data input buffer being controlled by the input buffer enabling signal to buffer and output the data during the enabling period of the input buffer enabling signal.

8. The input circuit of a semiconductor memory device as set forth in claim 7, wherein the write pulse generated by the write pulse generation unit is not synchronized with a clock.

9. The input circuit of a semiconductor memory device as set forth in claim 7, wherein the write pulse generated by the write pulse generation unit is enabled when the write command signal is enabled and has a predetermined pulse width.

10. The input circuit of a semiconductor memory device as set forth in claim 9, wherein the write pulse generation unit includes
    a delaying unit delaying the write command signal; and
    a combining unit performing a logical operation on the write command signal and an output of the delaying unit to generate the write pulse such that the pulse width of the write pulse corresponds to the delay of the write command signal.

11. The input circuit of a semiconductor memory device as set forth in claim 7, wherein the input buffer enabling signal generation unit comprises:
    a driving unit which performs a pull-up or pull-down drive in response to the write pulse;
    a latch unit latching an output of the driving unit and outputting the input buffer enabling signal; and
    a precharge unit precharging the output of the driving unit to a predetermined point corresponding to the burst length.

* * * * *